(12) United States Patent
Yang et al.

(10) Patent No.: US 9,716,035 B2
(45) Date of Patent: Jul. 25, 2017

(54) COMBINATION INTERCONNECT STRUCTURE AND METHODS OF FORMING SAME

(71) Applicant: Taiwan Semiconductor Manufacturing Company, Ltd., Hsin-Chu (TW)

(72) Inventors: Tai-I Yang, Hsin-Chu (TW); Yung-Chih Wang, Taoyuan (TW); Cheng-Chi Chuang, New Taipei (TW); Chia-Tien Wu, Taichung (TW); Tien-Lu Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 160 days.

(21) Appl. No.: 14/310,618

(22) Filed: Jun. 20, 2014

(65) Prior Publication Data

US 2015/0371939 A1    Dec. 24, 2015

(51) Int. Cl.
*H01L 21/768* (2006.01)
*H01L 23/532* (2006.01)
*H01L 23/528* (2006.01)

(52) U.S. Cl.
CPC .. *H01L 21/76877* (2013.01); *H01L 21/76838* (2013.01); *H01L 23/53223* (2013.01); *H01L 23/53238* (2013.01); *H01L 23/53266* (2013.01); *H01L 21/76819* (2013.01); *H01L 21/76834* (2013.01); *H01L 21/76885* (2013.01); *H01L 23/528* (2013.01); *H01L 23/5283* (2013.01); *H01L 2924/0002* (2013.01)

(58) Field of Classification Search
CPC ......... H01L 21/76877; H01L 23/53223; H01L 23/53238; H01L 23/53266; H01L 2924/0002; H01L 2924/00; H01L 21/76819; H01L 21/76834; H01L 21/76885; H01L 23/528; H01L 23/5283
See application file for complete search history.

(56) References Cited

U.S. PATENT DOCUMENTS

| | | | | |
|---|---|---|---|---|
| 4,545,852 A | * | 10/1985 | Barton | H01L 21/31055 204/192.36 |
| 4,676,867 A | * | 6/1987 | Elkins | H01L 21/31055 257/752 |
| 5,306,947 A | * | 4/1994 | Adachi | H01L 21/02137 257/635 |
| 5,399,533 A | * | 3/1995 | Pramanik | H01L 21/76819 257/E21.58 |
| 5,439,731 A | * | 8/1995 | Li | H01L 23/5283 174/126.2 |
| 5,604,380 A | * | 2/1997 | Nishimura | B32B 27/08 257/40 |
| 5,633,208 A | * | 5/1997 | Ishikawa | H01L 21/02126 257/E21.243 |
| 5,747,381 A | * | 5/1998 | Wu | H01L 21/31133 257/E21.255 |

(Continued)

*Primary Examiner* — Brett Feeney
*Assistant Examiner* — Sophia Nguyen
(74) *Attorney, Agent, or Firm* — Slater Matsil, LLP

(57) ABSTRACT

An embodiment semiconductor device includes a substrate and a dielectric layer over the substrate. The dielectric layer includes a first conductive line and a second conductive line. The second conductive line comprises a different conductive material than the first conductive line.

17 Claims, 17 Drawing Sheets

(56) References Cited

U.S. PATENT DOCUMENTS

| | | | | |
|---|---|---|---|---|
| 5,814,564 A * | 9/1998 | Yao | H01L 21/31055 | 216/38 |
| 5,880,018 A * | 3/1999 | Boeck | H01L 21/76807 | 257/E21.579 |
| 5,883,433 A * | 3/1999 | Oda | H01L 23/5222 | 257/750 |
| 5,945,739 A * | 8/1999 | Yajima | H01L 21/76819 | 257/280 |
| 6,008,120 A * | 12/1999 | Lee | H01L 21/02131 | 257/E21.269 |
| 6,156,637 A * | 12/2000 | Sonego | H01L 21/31051 | 257/E21.243 |
| 6,187,662 B1 * | 2/2001 | Usami | H01L 21/76834 | 257/758 |
| 6,218,291 B1 * | 4/2001 | Yoon | H01L 21/3212 | 257/E21.304 |
| 6,225,236 B1 * | 5/2001 | Nishimoto | H01L 21/02129 | 257/E21.243 |
| 6,277,732 B1 * | 8/2001 | Lou | H01L 21/76825 | 257/E21.576 |
| 6,331,481 B1 * | 12/2001 | Stamper | H01L 21/31053 | 257/E21.242 |
| 6,452,251 B1 * | 9/2002 | Bernstein | H01L 23/5223 | 257/301 |
| 6,475,917 B1 * | 11/2002 | Shen | H01L 21/31055 | 257/E21.245 |
| 6,680,514 B1 * | 1/2004 | Geffken | H01L 21/2885 | 257/368 |
| 6,746,914 B2 * | 6/2004 | Kai | H01L 28/60 | 257/306 |
| 6,831,015 B1 * | 12/2004 | Inoue | H01L 21/3105 | 257/E21.241 |
| 6,917,110 B2 * | 7/2005 | Matsubara | H01L 21/76802 | 257/635 |
| 6,960,834 B2 * | 11/2005 | Nakamura | H01L 21/76801 | 257/651 |
| 7,037,840 B2 * | 5/2006 | Katz | H01L 21/31053 | 257/E21.244 |
| 7,180,192 B2 * | 2/2007 | Hasunuma | H01L 21/76832 | 257/750 |
| 7,968,460 B2 * | 6/2011 | Kirby | H01L 21/743 | 257/621 |
| 8,405,222 B2 * | 3/2013 | Yu | H01L 21/7684 | 257/774 |
| 8,629,055 B2 * | 1/2014 | Sato | H01L 21/316 | 438/623 |
| 8,647,978 B1 * | 2/2014 | Ott | H01L 23/5222 | 257/738 |
| 8,836,109 B2 * | 9/2014 | Yun | H01L 23/481 | 257/700 |
| 9,054,164 B1 * | 6/2015 | Jezewski | H01L 21/76879 | |
| 9,059,166 B2 * | 6/2015 | Filippi | H01L 23/5226 | |
| 9,117,881 B2 * | 8/2015 | Huang | H01L 21/76802 | |
| 9,305,879 B2 * | 4/2016 | Filippi | H01L 23/5256 | |
| 9,373,579 B2 * | 6/2016 | Teng | H01L 23/5226 | |
| 2002/0192957 A1 * | 12/2002 | Chien | H01L 21/31116 | 438/689 |
| 2003/0022483 A1 * | 1/2003 | Shroff | H01L 21/76832 | 438/637 |
| 2003/0113669 A1 * | 6/2003 | Cheng | H05K 1/162 | 430/311 |
| 2003/0148631 A1 * | 8/2003 | Kuo | H01L 21/02137 | 438/782 |
| 2004/0140492 A1 * | 7/2004 | Ooishi | B82Y 10/00 | 257/295 |
| 2004/0155344 A1 * | 8/2004 | Yamada | H01L 23/53238 | 257/758 |
| 2004/0173912 A1 * | 9/2004 | Rhodes | H01L 21/76802 | 257/774 |
| 2004/0180551 A1 * | 9/2004 | Biles | H01L 21/32139 | 438/706 |
| 2005/0001326 A1 * | 1/2005 | Masuda | H01L 21/76898 | 257/774 |
| 2005/0106848 A1 * | 5/2005 | Bailey | H01J 37/32522 | 438/597 |
| 2006/0081883 A1 * | 4/2006 | Zhang | H01L 21/8221 | 257/208 |
| 2006/0170108 A1 * | 8/2006 | Hiroi | H01L 23/564 | 257/774 |
| 2007/0096325 A1 * | 5/2007 | Kishishita | H01L 21/76838 | 257/760 |
| 2007/0155163 A1 * | 7/2007 | Baek | H01L 21/76861 | 438/627 |
| 2007/0173029 A1 * | 7/2007 | Abadeer | H01L 28/60 | 438/396 |
| 2007/0212870 A1 * | 9/2007 | Yang | H01L 21/76849 | 438/618 |
| 2007/0259516 A1 * | 11/2007 | Jahnes | H01L 21/7682 | 438/618 |
| 2008/0026566 A1 | 1/2008 | Gambino et al. | | |
| 2008/0239618 A1 * | 10/2008 | Cremer | H01L 23/5223 | 361/302 |
| 2009/0026617 A1 * | 1/2009 | Park | H01L 21/76807 | 257/751 |
| 2009/0160058 A1 * | 6/2009 | Kuo | H01L 21/76898 | 257/758 |
| 2009/0267233 A1 * | 10/2009 | Lee | H01L 21/2007 | 257/758 |
| 2010/0193902 A1 * | 8/2010 | Shin | H01L 23/5258 | 257/529 |
| 2010/0237467 A1 * | 9/2010 | Dalton | H01L 21/76816 | 257/536 |
| 2011/0068424 A1 * | 3/2011 | Gambino | H01L 31/0203 | 257/432 |
| 2011/0190463 A1 * | 8/2011 | Xu | B82Y 10/00 | 526/317.1 |
| 2012/0313256 A1 * | 12/2012 | Lu | H01L 21/31144 | 257/774 |
| 2012/0319246 A1 * | 12/2012 | Tan | G06F 17/5068 | 257/618 |
| 2013/0043560 A1 * | 2/2013 | Tzeng | H01L 23/5223 | 257/532 |
| 2013/0069233 A1 * | 3/2013 | Chou | H01L 21/768 | 257/751 |
| 2013/0069234 A1 * | 3/2013 | Lee | H01L 23/53238 | 257/751 |
| 2013/0207270 A1 * | 8/2013 | Holmes | H01L 23/485 | 257/763 |
| 2013/0328201 A1 * | 12/2013 | Wang | H01L 23/481 | 257/762 |
| 2014/0021614 A1 * | 1/2014 | Yu | H01L 21/76802 | 257/751 |
| 2014/0077276 A1 * | 3/2014 | Anderson | H01L 29/78 | 257/288 |
| 2014/0091476 A1 * | 4/2014 | Nyhus | H01L 23/5226 | 257/774 |
| 2014/0096385 A1 * | 4/2014 | Watanabe | B41J 2/1603 | 29/890.1 |
| 2014/0117546 A1 * | 5/2014 | Liu | H01L 24/80 | 257/751 |
| 2014/0124932 A1 * | 5/2014 | Tsai | H01L 23/53233 | 257/751 |
| 2014/0147984 A1 * | 5/2014 | Zhang | H01L 21/76898 | 438/401 |
| 2014/0151893 A1 * | 6/2014 | Boyanov | H01L 23/5329 | 257/774 |
| 2014/0252624 A1 * | 9/2014 | Huang | H01L 21/76885 | 257/751 |
| 2014/0252630 A1 * | 9/2014 | Chang | H01L 23/528 | 257/763 |
| 2014/0264766 A1 * | 9/2014 | Wang | H01L 22/20 | 257/620 |
| 2014/0346674 A1 * | 11/2014 | Bao | H01L 23/53276 | 257/741 |
| 2015/0130080 A1 * | 5/2015 | Rhodes | H01L 23/481 | 257/774 |

(56) References Cited

U.S. PATENT DOCUMENTS

| | | | |
|---|---|---|---|
| 2015/0136459 A1* | 5/2015 | Kunieda | H05K 3/4682 |
| | | | 174/257 |
| 2015/0206845 A1* | 7/2015 | Lin | H01L 23/481 |
| | | | 257/632 |
| 2015/0264805 A1* | 9/2015 | Chen | H05K 3/0052 |
| | | | 361/748 |
| 2016/0005691 A1* | 1/2016 | Liu | H01L 21/76802 |
| | | | 257/758 |
| 2016/0118338 A1* | 4/2016 | Zhang | H01L 21/2855 |
| | | | 257/758 |

* cited by examiner

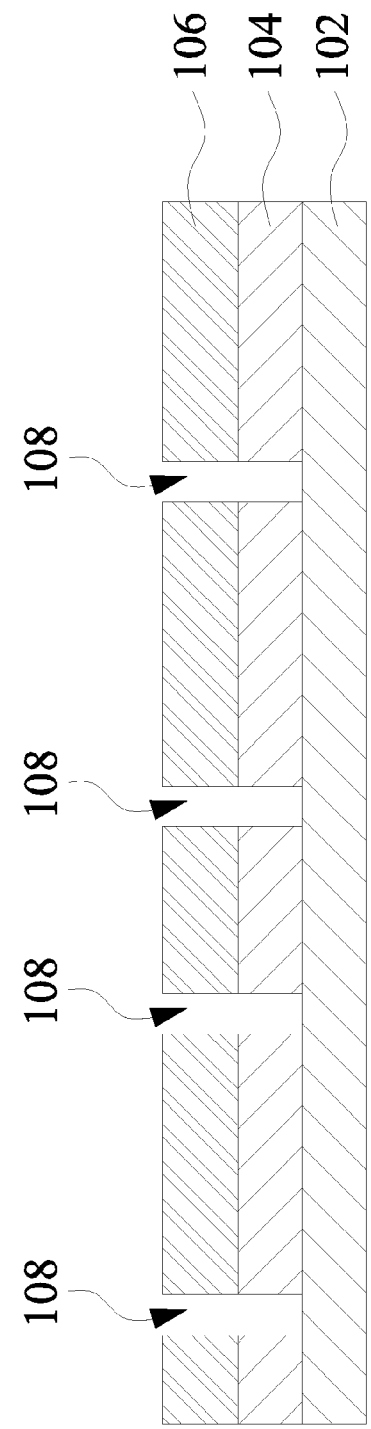

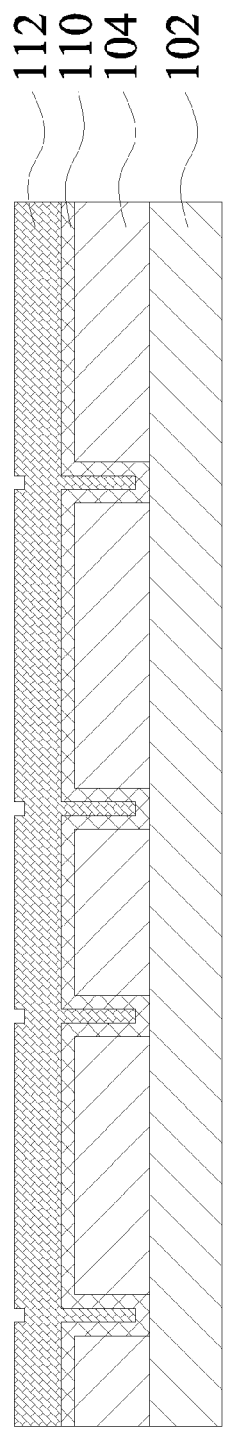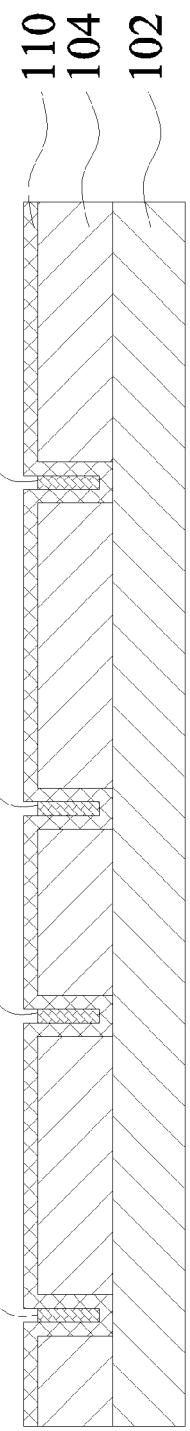

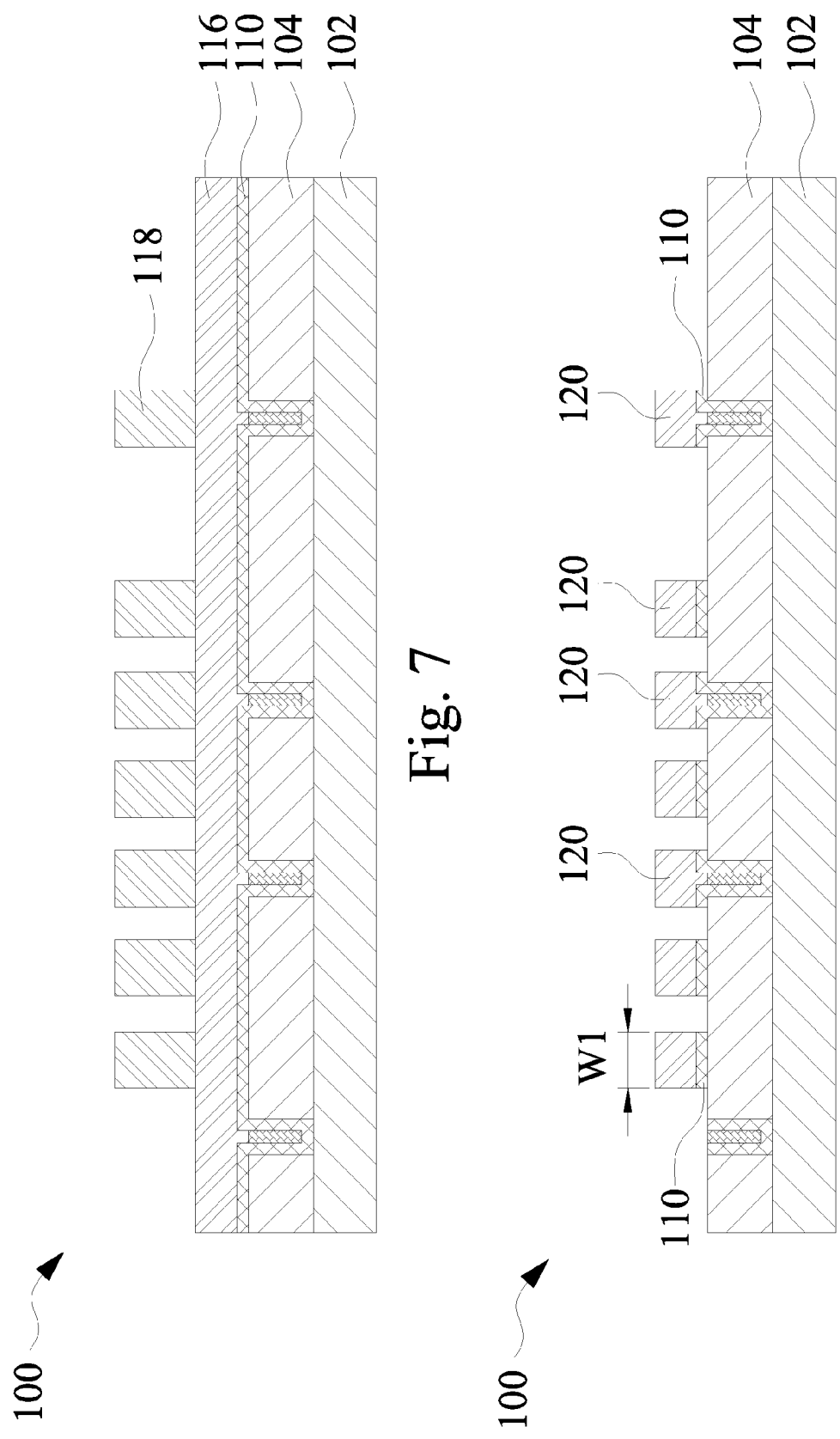

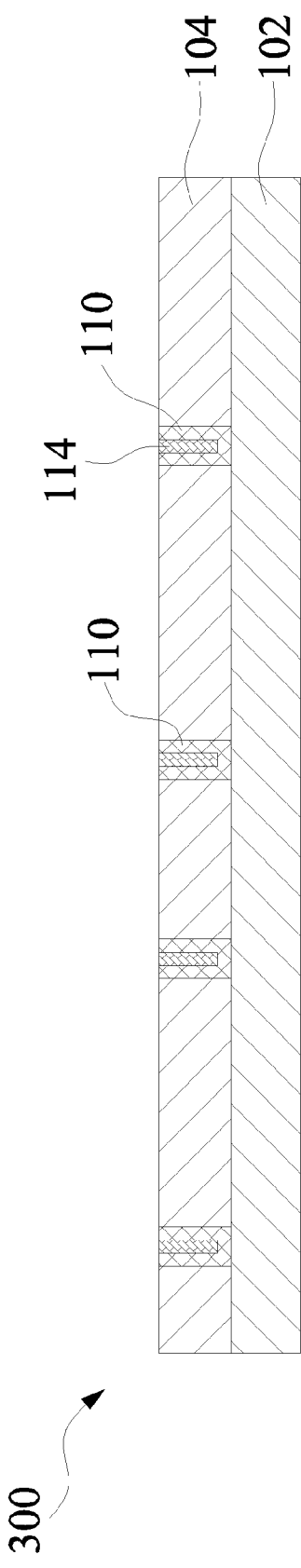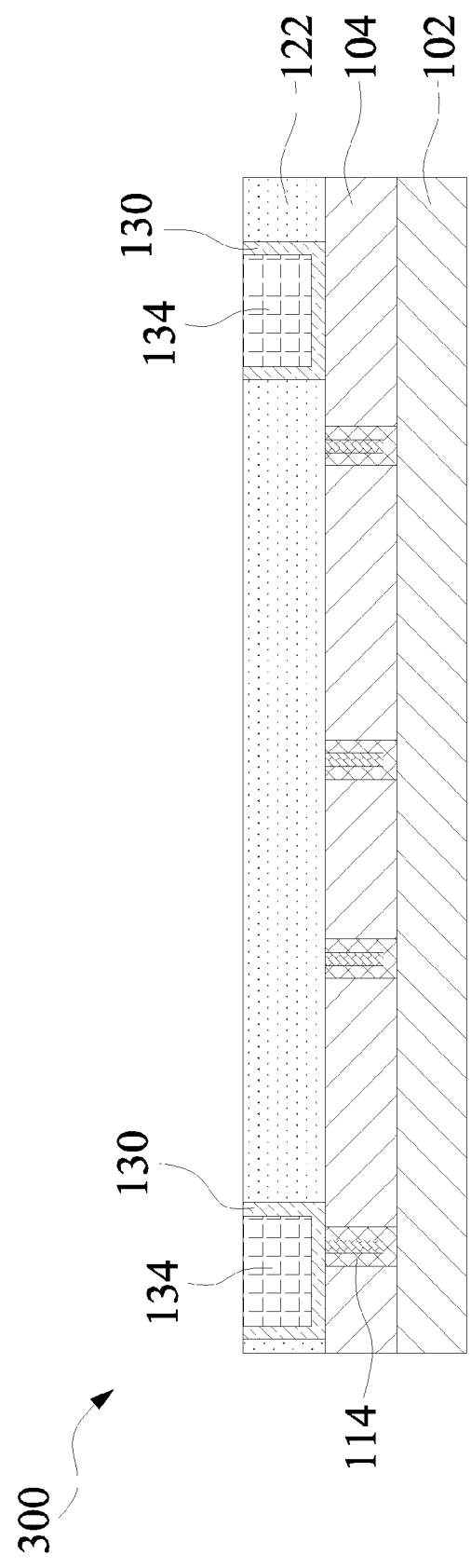

COMBINATION INTERCONNECT STRUCTURE AND METHODS OF FORMING SAME

BACKGROUND

Semiconductor devices are used in a variety of electronic applications, such as personal computers, cell phones, digital cameras, and other electronic equipment, as examples. Generally, a typical semiconductor device includes a substrate having active devices such as transistors and capacitors. These active devices are initially isolated from each other, and interconnect structures are subsequently formed over the active devices to create functional circuits. Generally these interconnect structures include conductive features (e.g., metal lines and vias) formed in a plurality of stacked dielectric layers.

Typically, different metal lines in a dielectric layer are formed of a same material, such as, copper. The use of copper may allow for improved electrical characteristics (e.g., improved electro-migration (EM) characteristics). However, as the dimensions of various features in semiconductor devices (including metal lines) shrink in advanced node devices, the continued use of copper for fine line-width applications may create complications in process formation and reduce device performance. For example, resistance of copper lines may increase to an undesirable level as line width decreases, voids may result from fine line-width formation processes using typical copper damascene processes, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 16A illustrate cross sectional views of various intermediary stages of manufacturing a semiconductor device in accordance with some embodiments.

FIGS. 20 through 25 illustrate cross sectional views of various intermediary stages of manufacturing a semiconductor device in accordance with some alternative embodiments.

DETAILED DESCRIPTION

Figure 5:
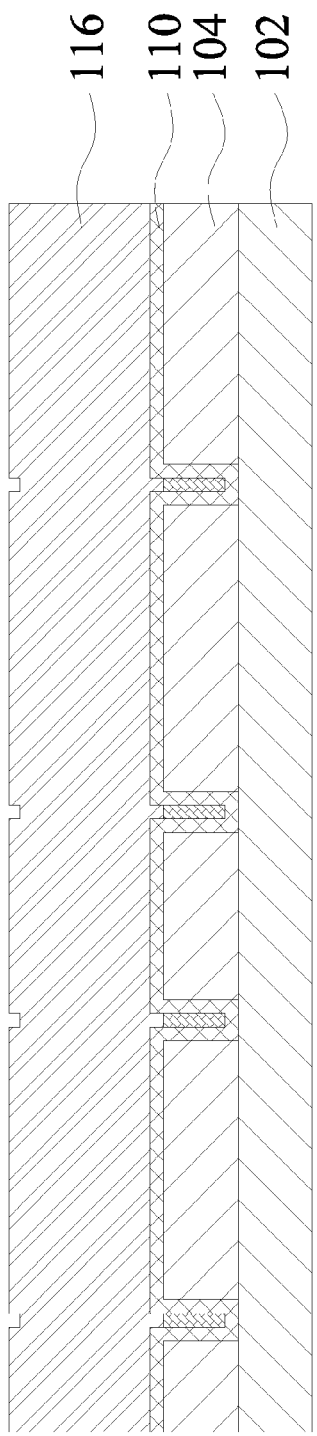

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include at least two different conductive materials in a single interconnect layer having conductive lines. For example, copper or a copper alloy may be used for larger conductive lines (e.g., having a line width greater than about 30 nm). In contrast, for fine-width conductive lines (e.g., having a line width less than about 30 nm), a different conductive material (e.g., aluminum, cobalt, tungsten, alloys thereof, combinations thereof, or the like) may be used. For example, two conductive lines having two different conductive materials may be disposed in a same interconnect layer and may share a common horizontal plane. By employing at least two different conductive materials in a single interconnect layer having conductive lines, the structure may take advantage of improved electrical characteristics (e.g., improved electro-migration (EM) characteristics) of copper in larger conductive lines while still providing reliability for fine-width conductive lines. In some embodiments, the formation of such fine-width conductive lines may include patterning a blanket-deposited conductive layer rather than a damascene process, increasing the reliability of the fine-line formation process.

FIGS. 1 through 16A illustrate cross sectional views of various intermediary stages of manufacturing a semiconductor device in accordance with some embodiments. FIGS. 1-4 describe the steps for forming vias. As is known, vias are used to "vertically" interconnect conductive features (e.g., contacts, conductive lines, and the like) in one layer to conductive features in an overlying or underlying layer. For example, although not explicitly illustrated, such vias may be used as electrical connect contacts to conductive features (e.g., other interconnect features), active devices (e.g., source/drain contacts, gate contacts, and the like), and the like underlying the vias.

FIG. 1 illustrates a semiconductor device 100 having a substrate 102 and a dielectric layer 104. Substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, GaInAsP; or combinations thereof. Other substrates, such as multi-layered or gradient substrates, may also be used. Active devices (not shown), such as transistors, capacitors, diodes, and the like, may be formed on a top surface of substrate 102.

A dielectric layer 104 is formed over substrate 102. Dielectric layer 104 may be an inter-layer dielectric (ILD) or an inter-metal dielectric layer (IMD) formed over the substrate using any suitable method (e.g., chemical vapor deposition (CVD), plasma enhanced CVD (PECVD), or the like). Dielectric layer 104 may be formed of low-k dielectric materials having a k value, for example, lower than about 4.0 or even about 2.0. In some embodiments, dielectric layer 104 may comprise silicon oxide, SiCOH, and the like. Although FIG. 1 illustrates dielectric layer 104 as directly above and contacting substrate 102, there may be any number of additional layers (e.g., other dielectric layers having conductive interconnect features, etch stop layers, isolation layers, buffer layers, and the like) disposed between dielectric layer 104 and substrate 102.

In FIG. 2, a patterned photoresist 106 is formed over dielectric layer 104. Photoresist 106 may be deposited as a blanket layer over dielectric layer 104. Next, portions of photoresist 106 may be exposed using a photo mask (not shown). Exposed or unexposed portions of photoresist 106 are then removed depending on whether a negative or positive resist is used, creating openings 108 extending through photoresist 106. As further illustrated by FIG. 2, dielectric layer 104 may be patterned using photoresist 106 as a patterning mask. For example, dry and/or wet etching techniques may be used to etch portions of dielectric layer 104 exposed by openings 108. The etching extends openings 108 through dielectric layer 104. Subsequently, photoresist 106 is removed in an ashing and/or wet strip processes, for example. In some embodiments, a hard mask (not shown) might be formed atop dielectric layer 104 prior to formation of photoresist 106, in which embodiments the pattern from photoresist 106 would first be imposed upon the hard mask and the patterned hard mask would be used in patterning dielectric layer 104.

Referring next to FIG. 3, a barrier layer 110 and a conductive layer 112 may be deposited in openings 108 and over dielectric layer 104. First, barrier layer 110 is deposited along sidewalls and bottom surfaces of openings 108 using a suitable process such as, physical vapor deposition (PVD), chemical vapor deposition (CVD), and the like. Barrier layer 110 may further be deposited over a top surface of dielectric layer 104. Barrier layer 110 may act as a diffusion barrier layer, a stress reducer, and/or etch stop layer in device 100. In some embodiments, barrier layer may comprise titanium, titanium nitride, and the like. Next, conductive layer 112 (e.g., comprising colbalt (Co), tungsten (W), and the like) may be deposited over barrier layer 110 using a suitable process such as PVD, CVD, and the like. Conductive layer 112 fills openings 108. Alternatively, a seed layer may be deposited on sidewalls and bottom surfaces of openings 108. Remaining portions of openings 108 may then be filled with conductive layer 112 using an electro-chemical plating process, for example. The seed layer may be deposited using a suitable process such as PVD, CVD, and the like, and the seed layer may comprise, Co, W, and the like, for example. The deposition of conductive layer 112 may further overflow openings 108 and cover a top surface of barrier layer 110/dielectric layer 104.

FIG. 4 illustrates removal of excess conductive material from a top surface of barrier layer 110. In some embodiments a planarization process, such as a chemical-mechanical polishing (CMP) process or other etch back technique is used to remove the excess materials, thereby forming vias 114 in dielectric layer 104. Vias 114 may be electrically connected to any interconnect structures underlying dielectric layer 104 and/or various active devices (not shown) on substrate 102. Barrier layer 110 may act as an etch stop layer during the planarization process, and after planarization, barrier layer 110 may remain on a top surface of dielectric layer 104.

Figure 6:
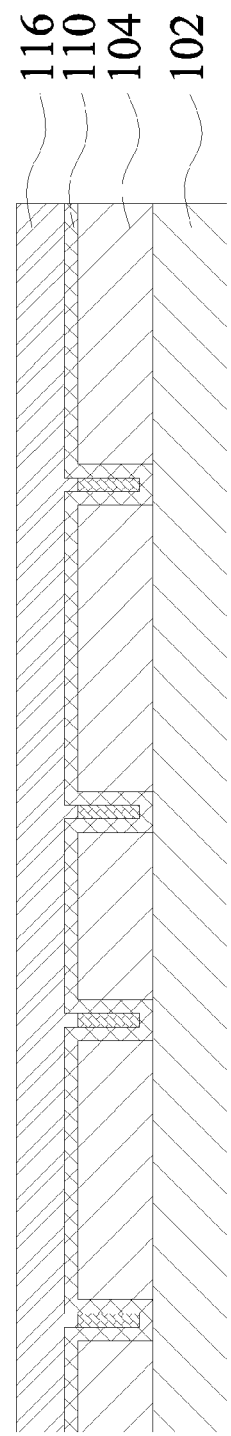

Illustrative steps for forming in the illustrated interconnect layer a first group of conductive lines using a first process (blanket deposition followed by patterning) are now described with reference to FIGS. 5 through 8. In FIG. 5, a conductive layer 116 is blanket deposited over barrier layer 110, for example, using PVD, CVD, atomic layer deposition (ALD), and the like. In some embodiments, conductive layer 116 may comprise aluminum (Al), aluminum copper (AlCu), aluminum manganese (AlMn), Co, W, alloys thereof, combination thereof, and the like. The material of conductive layer 116 may be selected to have good reliability characteristics (e.g., resistance, EM characteristics, and the like) in fine-width metal lines. The material of conductive layer 116 may also be selected to have good reliability during etching in subsequent process steps. Next, conductive layer 116 may be planarized (e.g., using a CMP process or other etch back technique) to achieve a desired thickness for conductive layer 116. The planarization may further level a top surface of conductive layer 116. The resulting structure is illustrated in FIG. 6.

FIGS. 7 and 8 illustrate the patterning of conductive layer 116 using a combination of photolithography and etching. In FIG. 7, a patterned photoresist 118 is formed over conductive layer 116. In FIG. 8, conductive layer 116 is etched using photoresist 118 as a patterning mask. The etching of conductive layer 116 may include a wet and/or dry etching process using a suitable chemical etchant. The chemical etchant used may vary depending on the composition of conductive layer 116. For example, a chlorine based etchant may be used when conductive layer 116 comprises Al while a fluorine based etchant may be used when conductive layer 116 comprises Co or W. Barrier layer 110 may also be patterned using the same or a separate etching process also using photoresist 118 as a patterning mask. Photoresist 118 is then removed. In some embodiments, a hard mask (not shown) may be employed to assist in the patterning process (es).

Thus, fine-width conductive lines 120 are formed over dielectric layer 104. Conductive lines 120 may have a width W1 that is less than about 30 nm. In some embodiments, conductive lines 120 may have a width between about 5 nm to about 30 nm. Furthermore, the spacing between adjacent conductive lines 120 may be between about 10 nm to about 50 nm, for example. Other dimensions for conductive lines 120 and/or spacing between conductive lines 120 may be employed depending on device design. In various devices, conductive lines 120 may be used for alternating current (AC) power lines, low resistance lines, signal lines, and the like. Barrier layer 110 may act as a diffusion barrier layer that prevents the diffusion of the conductive material into dielectric layer 104.

Figure 9:
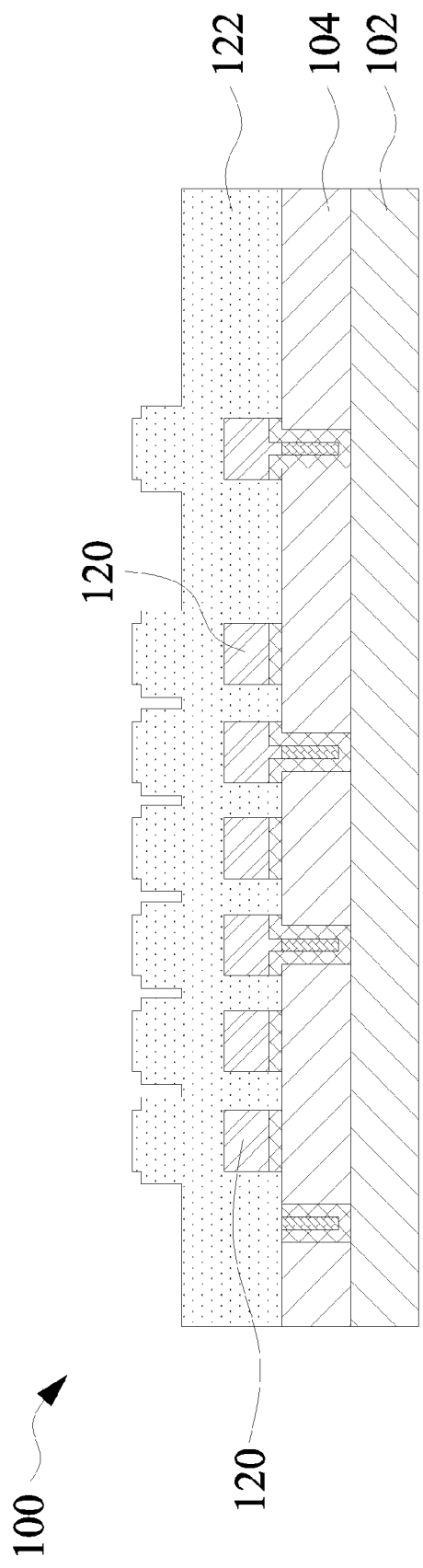
Figure 10:
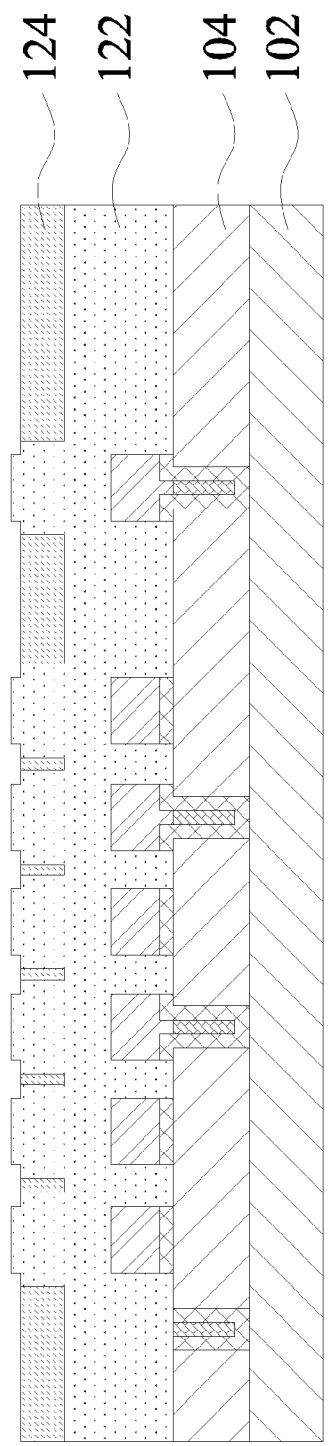
Figure 11:
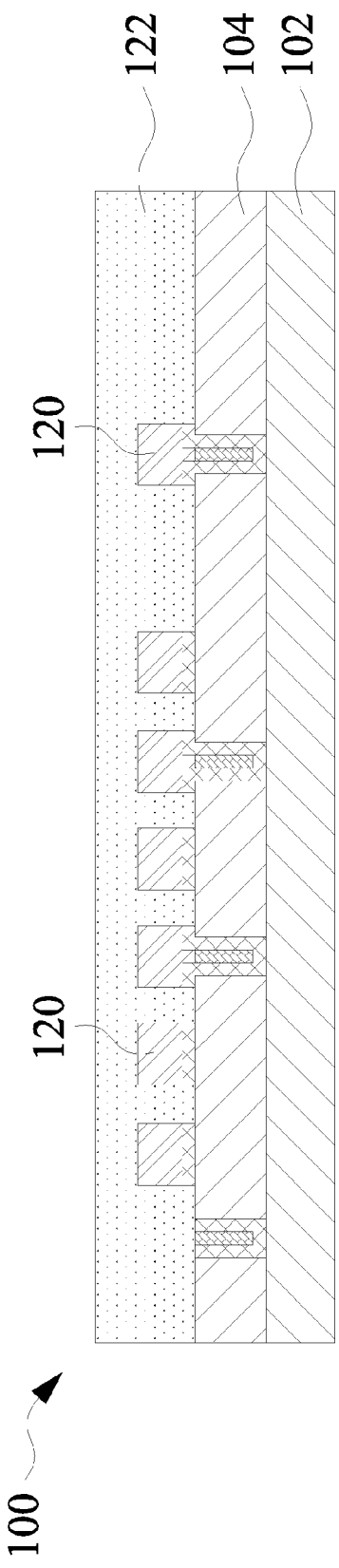

FIGS. 9 through 11 illustrate the formation of a planarized dielectric layer over conductive lines 120 in accordance with some embodiments. In FIG. 9, a low-k dielectric layer 122 may be deposited over conductive lines 120, for example, using PVD, CVD, and the like. In some embodiments, dielectric layer 122 may be deposited using a spin-on process. Dielectric layer 122 may comprise a substantially similar material as dielectric layer 104, although different dielectric materials are also within the contemplated scope of the present disclosure. In the embodiment process illustrated in FIGS. 7 through 9, conductive lines 120 are formed by patterning a blanket-deposited conductive layer 116 rather than using a damascene process. For example, in a damascene process, patterned openings in dielectric layer 122 are filled. The filling process may involve the deposition of a seed layer in such openings and an electro-chemical plating process. By avoiding a damascene process, conductive lines 120 may be formed without first forming any seed layers, thereby reducing resistance of conductive lines 120 and improving the reliability of the formation process.

In some embodiments, the deposition of dielectric layer 122 may be a conformal process, and a top level of dielectric layer 122 may not be substantially level. Thus, an additional dielectric material, such as dielectric film 124, may be deposited over portions of dielectric layer 122 using a spin-on process, for example. Dielectric film may be used to at least partially planarize a top surface of dielectric layer 122. Dielectric film 124 may be formed of a same or a different dielectric material as dielectric layer 122. Subsequently, a planarization, such as a CMP or other etch back technique, may be applied to achieve a desired thickness for dielectric layer 122. The resulting structure is illustrated in FIG. 11. After planarization, dielectric layer 122 may still cover top surfaces of conductive lines 120. In some embodiments, dielectric layer 122 may be deposited to a sufficient thickness (not shown) such that the non-planarity of the deposited dielectric layer can be eliminated through a CMP process without the need for dielectric film 124.

Figure 12:
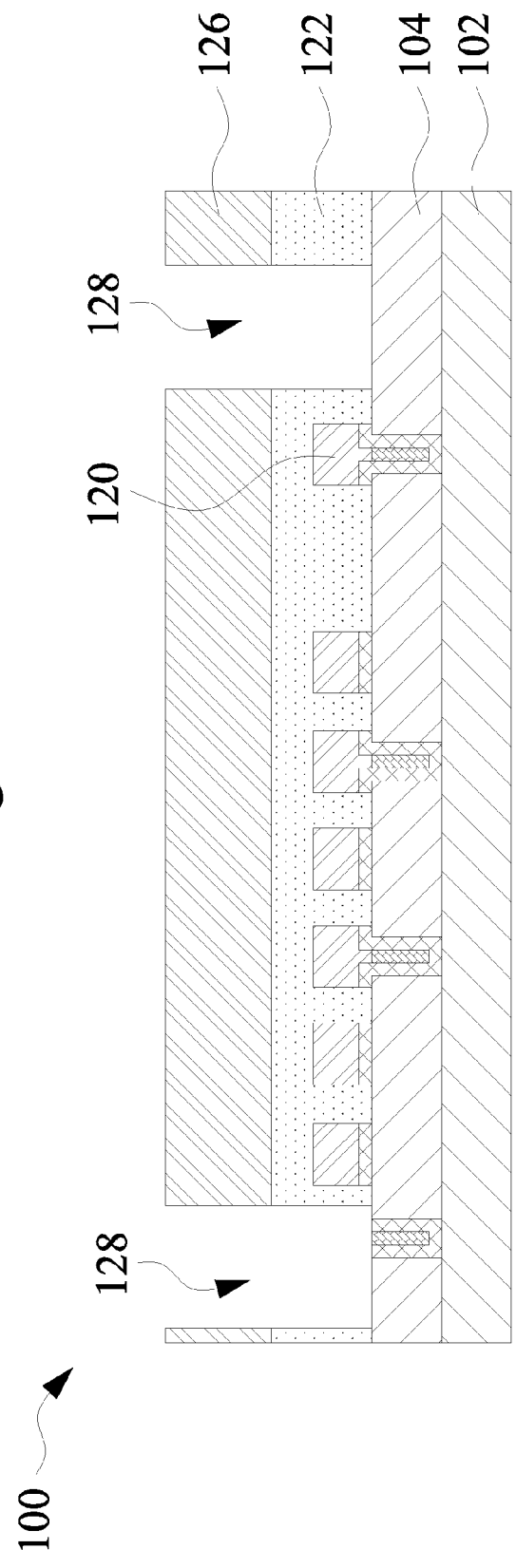
Figure 13:
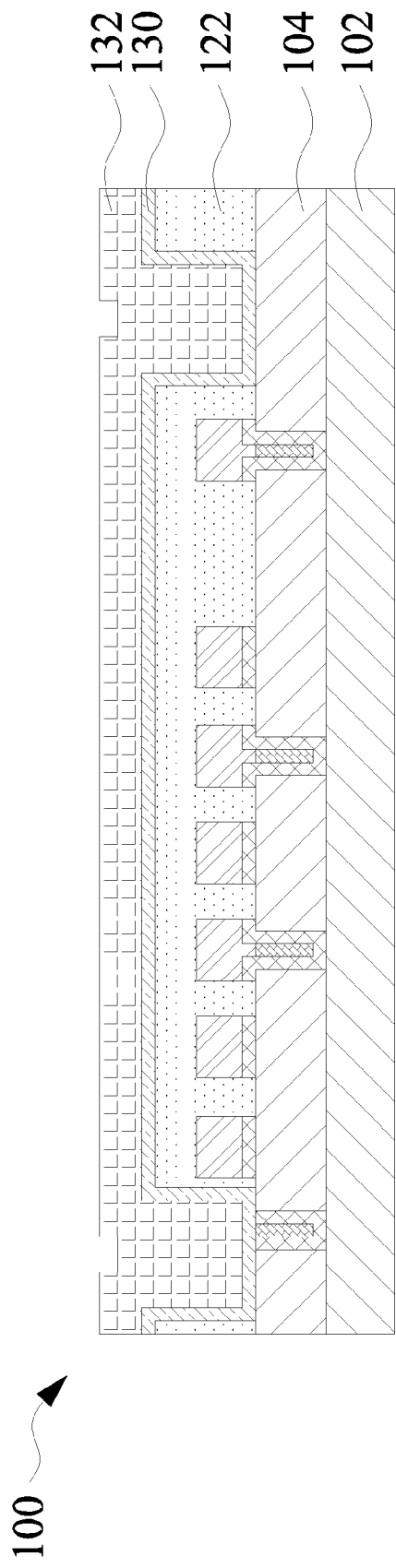
Figure 14:
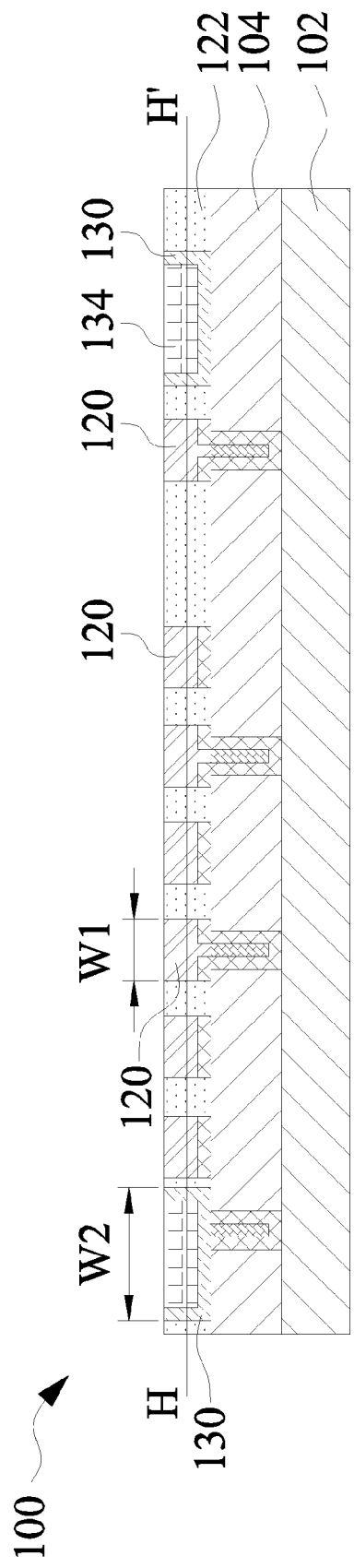

FIGS. 12 through 14 illustrate the formation of additional conductive lines 134 in dielectric layer 122. In FIG. 12, a patterned photoresist 126 is formed over a top surface of dielectric layer 122. Photoresist 126 may include openings 128, which may be aligned with areas of dielectric layer 122 not occupied by conductive lines 120. Subsequently, dielectric layer 122 may be etched using photoresist 126, and an intervening hard mask (not shown) if employed, as a patterning mask to extend openings 128 through dielectric layer 122. Photoresist 126 may then be removed.

In FIG. 13, a barrier layer 130 and conductive layer 132 is formed over dielectric layer 122. Conductive layer 132 may be formed by depositing one or more diffusion and/or barrier layers and depositing a seed layer. For example, barrier layer 130 comprising one or more layers of Ta, TaN, or the like is formed along sidewalls and bottom surfaces of openings 128. The seed layer (not shown) may be formed of copper, or the like. Barrier layer 130 and the seed layer may be formed by suitable deposition techniques such as PVD, CVD and/or the like. Once the seed layer has been deposited in opening 128, a conductive material is filled into openings 128 using, for example, an electro-chemical plating process. Conductive layer 132 may comprise a different conductive material as conductive lines 120. For example, conductive layer 132 may comprise copper, a copper alloy, or the like. In some embodiments, conductive layer 132 may overfill openings 128.

FIG. 14 illustrates removal of excess materials such as excess conductive layer 132, barrier layer 130, and dielectric layer 122 over conductive lines 120. In some embodiments a planarization process, CMP or other etch back technique is used to remove the excess materials, thus forming conductive lines 134 in dielectric layer 122. The planarization exposes conductive lines 120, and in the resulting structure, top surfaces of conductive lines 120, dielectric layer 122, and conductive lines 134 may be substantially level.

In various embodiments, conductive lines 134 may be wider than conductive lines 120. For example, conductive lines 134 may have a width W2 that is greater than about 30 nm. Conductive lines 134 may be used as power rail lines, direct current (DC) power lines, higher reliability signal lines, and the like. Furthermore, conductive lines 120 and 134 may comprise different conductive materials. For example, conductive lines 120 may comprise Al, Co, W, and the like while conductive lines 134 may comprise copper. Conductive lines 120 and/or 134 may by electrically connected to vias 114 in dielectric layer 104, which may electrically connect conductive lines 120/134 with active devices (not shown) on substrate 102.

Thus, conductive lines 120 and 134 are formed in a single dielectric layer 122. In some embodiments, conductive lines 120 and 134 may intersect a common horizontal plane (e.g., the horizontal plane indicated by line HH'). The term "horizontal" is used herein to signify a plane that is generally parallel to a major surface of substrate 102, and "horizontal" is not used herein as an absolute indicator of orientation. For example, horizontal is not meant to necessarily indicate an orientation that is parallel to the Earth.

Figure 15:
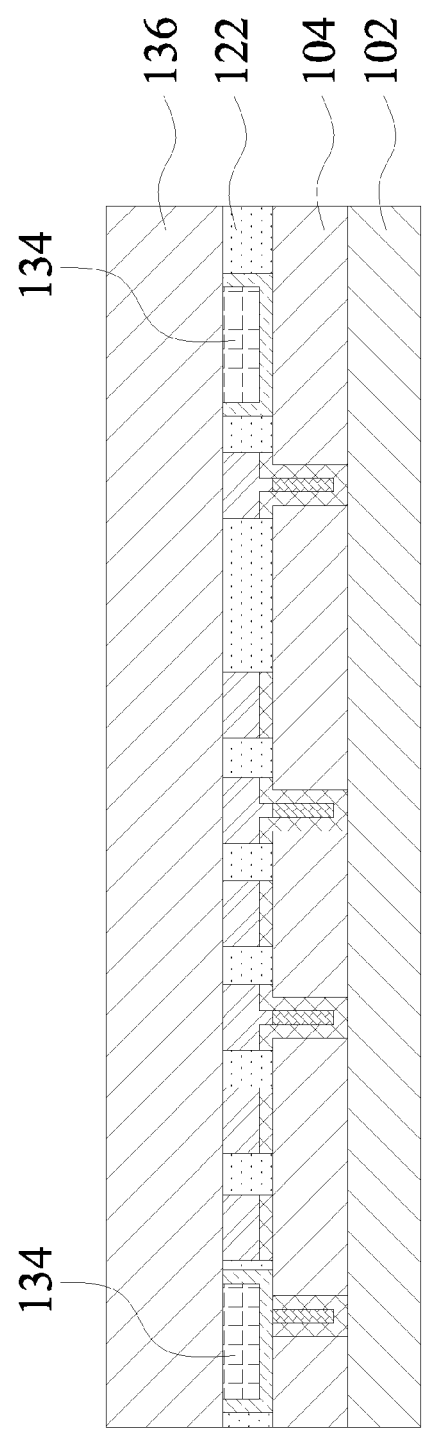
Figure 16A:
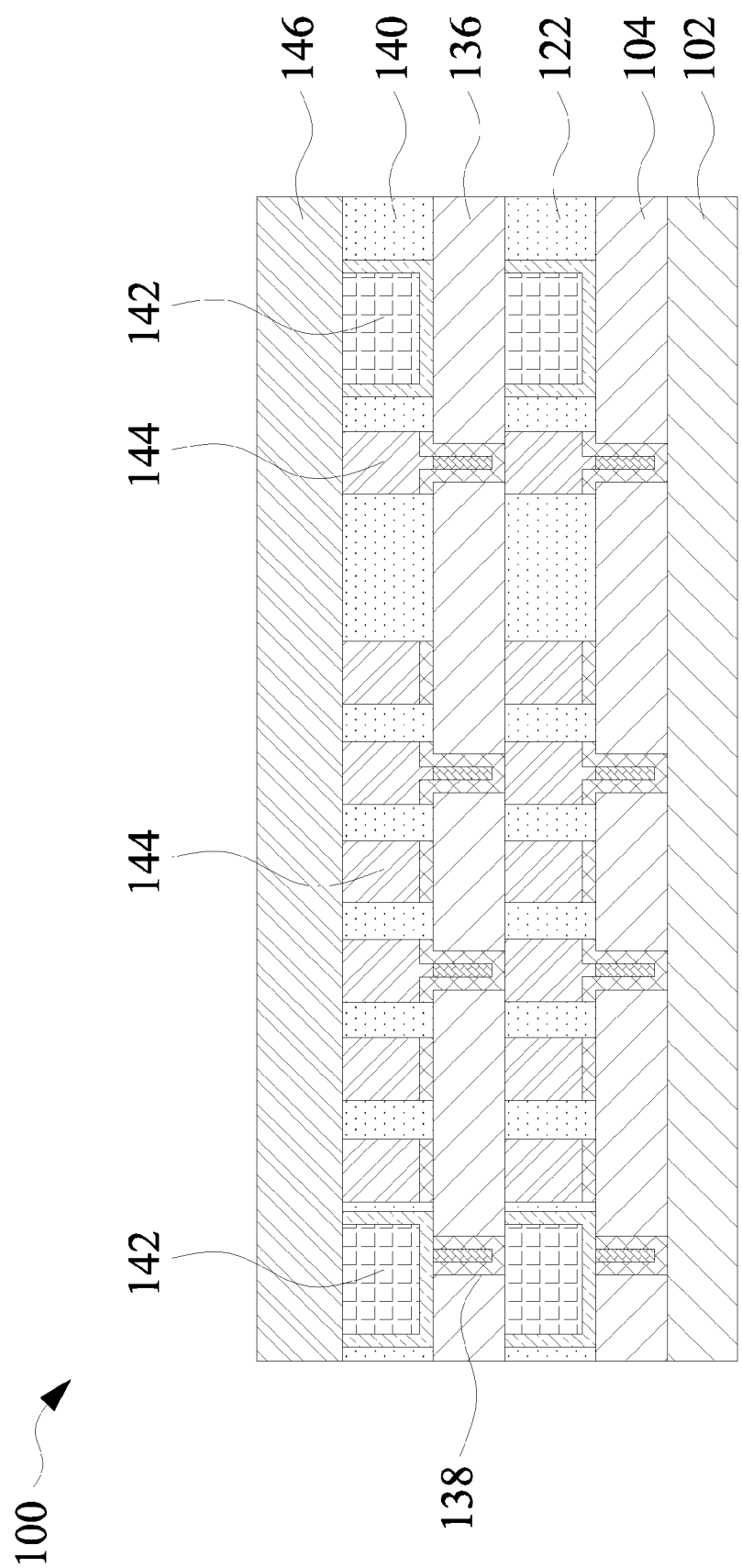

In FIG. 15, a dielectric layer 136 (e.g., a low-k dielectric) is disposed over dielectric layer 122 and conductive lines 120/134. FIG. 16A illustrates the formation of additional features in device 100. For example, vias 138 may be formed in dielectric layer 136, and additional conductive lines 142/144 may be formed in a dielectric layer 140 over dielectric layer 136. The formation of dielectric layer 136 (having vias 138) and dielectric layer 140 (having conductive lines 142 and 144) may be done using substantially similar process steps as those illustrated by FIGS. 1 through 14. Thus detailed description of the formation of these features is omitted for brevity.

Conductive lines 144 may be fine-width lines having a width less than about 30 nm while conductive lines 142 may be wider lines having a width greater than about 30 nm. Furthermore, conductive lines 142 may comprise copper while conductive lines 144 may comprise a different conductive material, such as, Al, AlCu, AlMn, Co, W, and the like. Furthermore a passivation layer (e.g., comprising silicon oxide) may be disposed over dielectric layer 140. Various conductive features (e.g., various metal lines and vias) may electrically connect active devices on substrate 102 to form functional circuits in device 100.

Although not illustrated, additional features (e.g., input/output features such as contact pads) may also be formed in device 100. Furthermore, the configuration of device 100 illustrated in FIG. 16A is merely an example, and other configurations may be used as well. For example, device 100 may include any number of dielectric layers (having conductive vias and/or lines) depending on device design. Furthermore, each dielectric layer in device 100 may include only wide conductive lines (e.g., comprising copper), only fine-width conductive lines (e.g., comprising Al, Co, W, and the like), or any combination thereof.

Figure 16B:
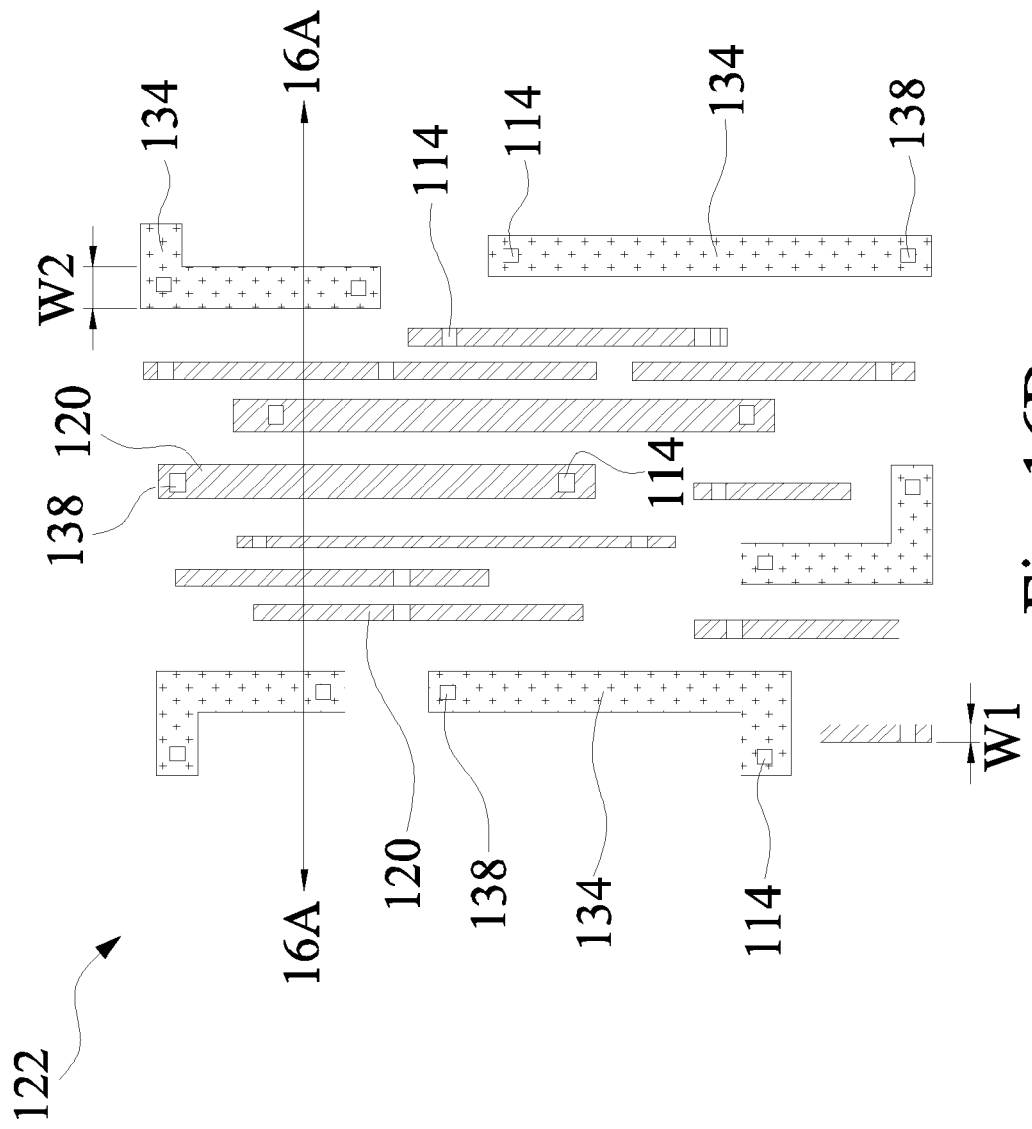
FIG. 16B illustrates a top-down view of a semiconductor device in accordance with some embodiments.

FIG. 16B illustrates a top down view of a dielectric layer (e.g., layer 122) in device 100. Dielectric layer 122 may include both fine-width conductive lines 120 and wide conductive lines 134. Vias 114 and/or 138 may be electrically connected to conductive lines 120 and/or 134. In various embodiments, conductive lines 120 and 134 may comprise at least two different materials. The use of at least two different conductive materials for differently sized conductive lines allows for various advantages in device 100. For example, wider conductive lines may take advantage of the improved electrical characteristics (e.g., resistance, EM characteristics, and the like) of copper. However, the reliability of copper lines is reduced in finer-width conductive lines (e.g., lines having a width less than about 30 nm). Thus, a different conductive material may be used for finer-width conductive lines to allow for improved process and/or electrical reliability.

Figures 17, 18:
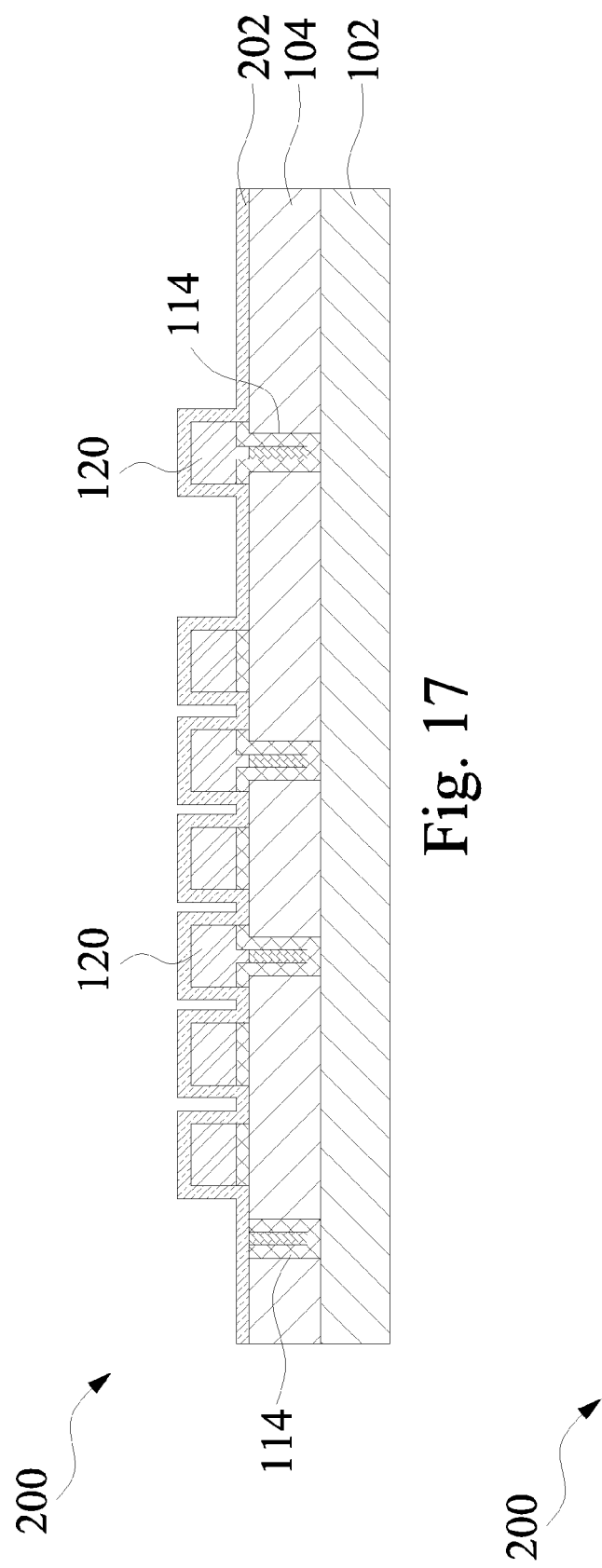
FIGS. 17 through 19 illustrate cross sectional views of various intermediary stages of manufacturing an alternative semiconductor device in accordance with some embodiments.
Figure 19:
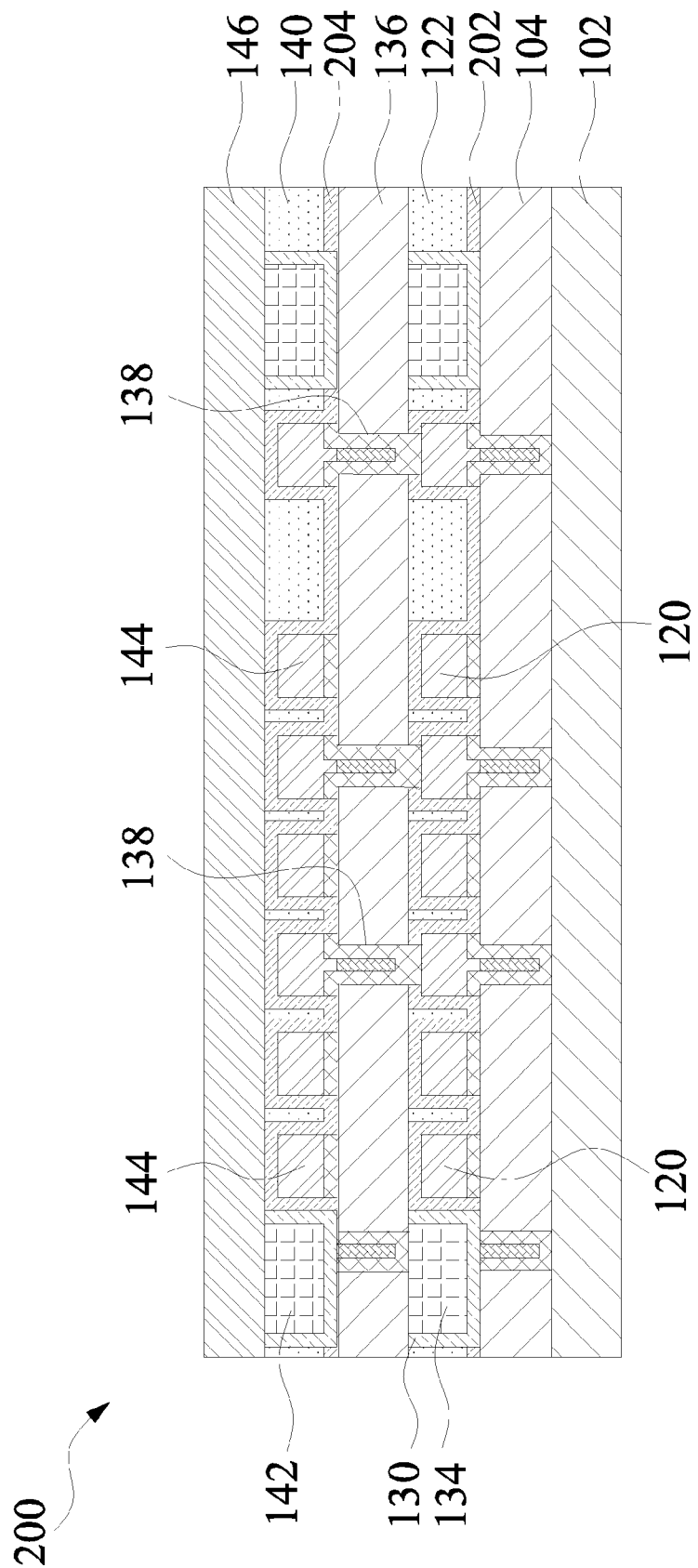

FIGS. 17 through 19 illustrate cross sectional views of various intermediary steps of manufacturing a semiconductor device 200 having an additional barrier layer 202. Device 200 may include similar features as device 100 where like reference numerals indicate like elements formed using like processing steps. FIG. 17 illustrates the formation of a barrier layer 202 over conductive lines 120. Barrier layer 202 may cover top surfaces of conductive lines 120 and dielectric layer 104, and barrier layer 202 may further cover sidewalls of conductive lines 120. In some embodiments, barrier layer 202 may comprise a high-k dielectric material having a k-value greater than about 4.0, for example. Other materials may also be used. The formation of barrier layer 202 may include a suitable process, such as PVD, CVD, and the like.

FIG. 18 illustrates the formation of dielectric layer 122 and dielectric film 124 over barrier layer 202. Barrier layer 202 covers top surfaces and sidewalls of conductive lines 120, and barrier layer 202 may prevent (or reduce) the diffusion of conductive material into dielectric layer 122 from conductive lines 120. FIG. 19 illustrates a completed device 200. Additional process steps (e.g., to form conductive lines 124) between FIGS. 18 and 19 may be similar to the process illustrated by FIGS. 10 through 16A where like reference numerals indicate like elements formed using like processing steps. In device 200, a barrier layer 202 and 204 may be disposed on sidewalls of conductive lines 120 and 144, respectively. Barrier layer 202 and 204 may comprise a high-k material, which prevents (or reduces) the diffusion of conductive material into the surrounding dielectric material from conductive lines 120 or 144. As further illustrated by FIGS. 18 and 19, dielectric layer 122 and dielectric film 124 may be reduced. After dielectric layer 122 and dielectric film 124 is reduced, a portion of dielectric film 124 covers a top surface of barrier layer 202 as shown by FIG. 19.

Barrier layers 202 and 204 may further cover portions of top surfaces of conductive lines 120 and 144, respectively. However, portions of barrier layer 202 over conductive lines 120 may be removed as illustrated by FIG. 19. For example, the formation of was 138 may include patterning openings in dielectric layer 136. The openings may expose portions of barrier layer 202, and these exposed portions of barrier layer 202 may be removed using a suitable etching process. In some embodiments, a dry etching process using $C_xF_y$ gas as a process gas or a wet etching process using diluted hydrogen fluoride (HF) may be employed to remove exposed portions of barrier layer 202. If additional interconnect layers (e.g., dielectric layers having vias and/or additional conductive lines are formed over conductive lines 142 and 144, portions of barrier layer 204 on top surfaces of conductive lines 144 may also be removed.

FIGS. 20 through 25 illustrates cross sectional views of various intermediary steps of manufacturing a semiconductor device 300 using a damascene process to form fine-width conductive lines 120. Device 300 may include similar features as device 100 where like reference numerals indicate like elements.

FIG. 20 illustrates a cross-sectional view of a device 300 having a substrate 102. Dielectric layer 104 having vias 114 disposed therein is formed over substrate 102. Barrier layer 110 may be disposed on sidewalls and bottom surfaces of vias 114. Unlike device 100, portions of barrier layer 110 over dielectric layer 104 are removed in a planarization process, for example. In device 300, top surfaces of dielectric layer 104, vias 114, and barrier layer 110 may be substantially level.

FIG. 21 illustrates the formation of dielectric layer 122 over dielectric layer 104. Conductive lines 134 (e.g., having barrier layer 130 disposed on sidewalls and bottom surfaces) may be formed in dielectric layer 122 using processes similar to those described above. Conductive lines 134 may have a width greater than about 30 nm, and conductive lines 134 may comprise copper, for example. Furthermore, as illustrated by FIG. 21, conductive lines 134 are formed prior to the formation of fine-width conductive lines in dielectric layer 122 (e.g., conductive lines 120). In alternative embodiments, conductive lines 134 may be formed after the formation of fine-width conductive lines 120 in dielectric layer 122.

Figure 22:
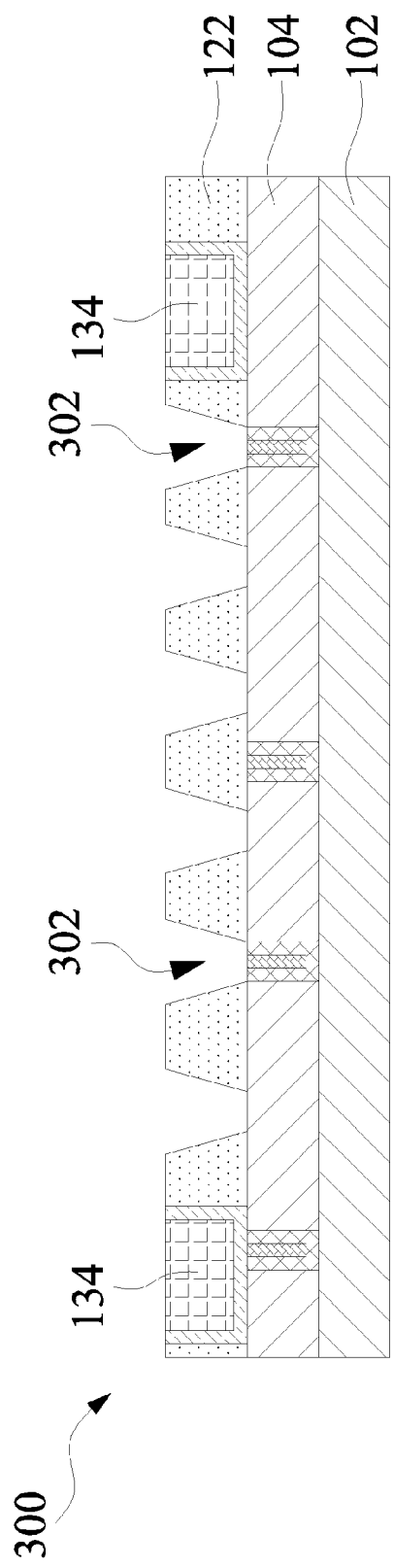

Next, in FIG. 22, dielectric layer 122 is patterned to form openings 302, for example, using a combination of photolithography and etching. The etching process may include a wet or dry etching process using a chemical etchant that selectively etches dielectric layer 122 without etching conductive lines 134. As a result of the etching process, openings 302 may be wider at a top surface of dielectric layer 122 than at a bottom surface of dielectric layer 122.

Figure 23:
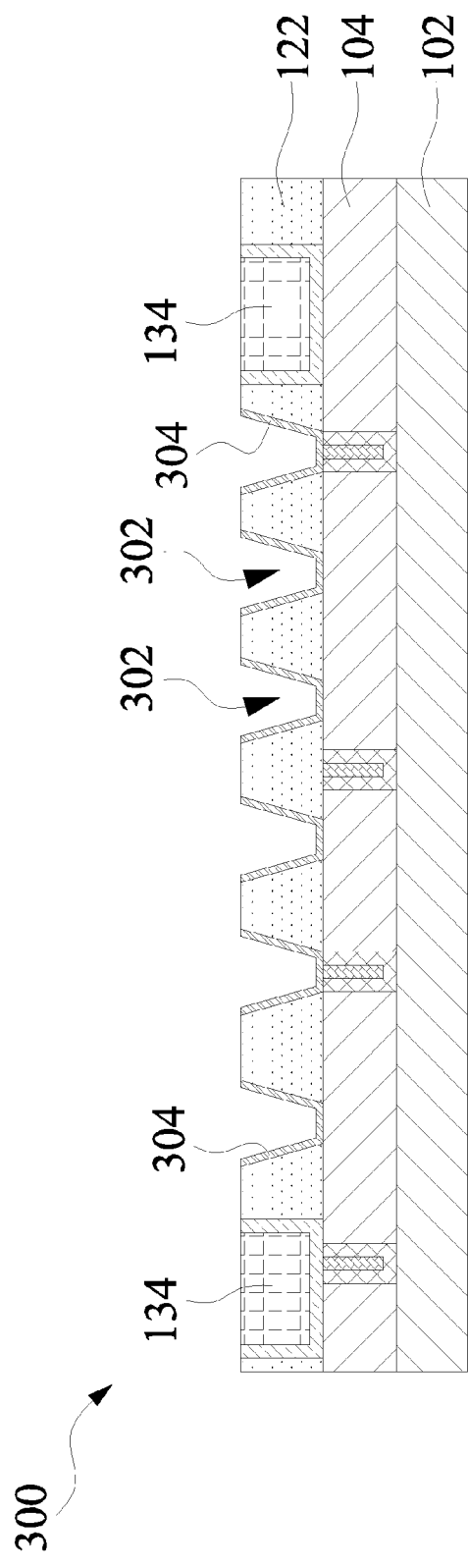
Figure 24:
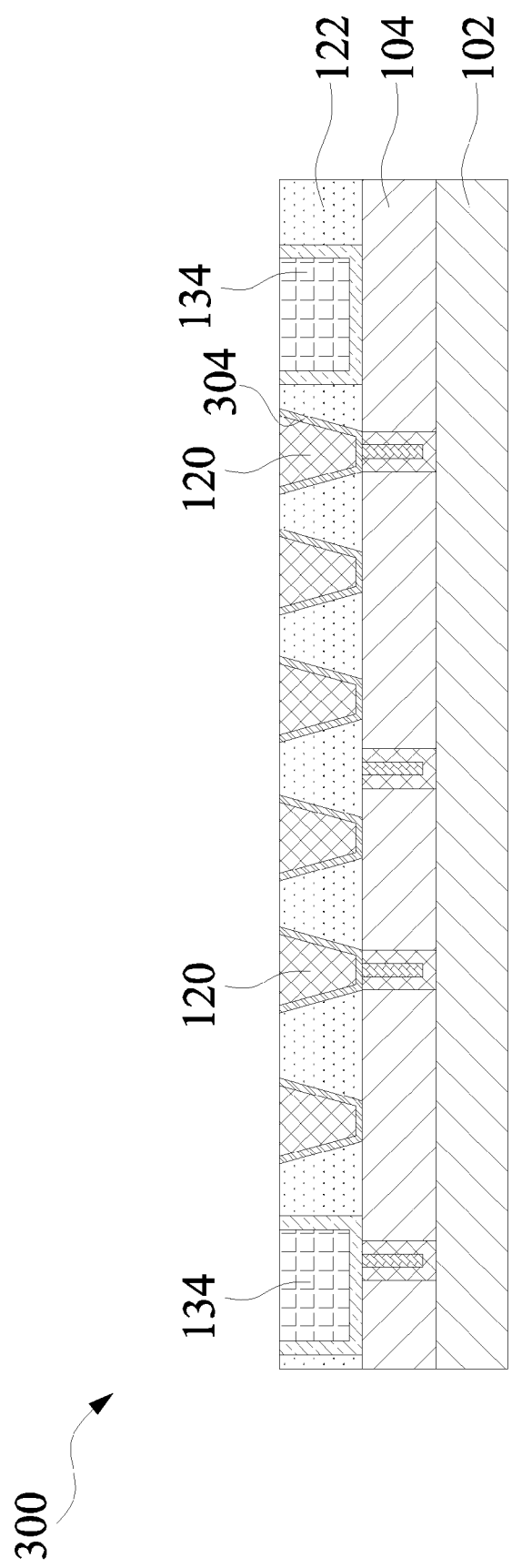

FIGS. 23 and 24 illustrate the formation of seed layer 304 and fine-width conductive lines 120 in dielectric layer 122. In FIG. 23, a seed layer is formed along sidewalls and bottom surfaces of openings 302. Seed layer 304 may be formed of Al, Co, W, alloys thereof, combinations thereof, or the like. Seed layer 304 may be formed by suitable deposition techniques such as PVD, CVD and/or the like. After seed layer 304 has been deposited in openings 302, a conductive material is filled into openings 302 using, for example, an electro-chemical plating process. The conductive material may comprise a different material than conductive lines 134. For example, the conductive material may comprise Al, AlMn, AlCu, Co, W, alloys thereof, combinations thereof, or the like.

The filling of the conductive material may overfill openings 302. Subsequently, excess conductive material over dielectric layer 122 is removed. In some embodiments a planarization process, CMP or other etch back technique is used to remove the excess materials, thus forming conductive lines 120 in dielectric layer 122. Conductive lines 120 may be fine-width lines having a width less than about 30 nm, for example. The planarization process further exposes conductive lines 134. In the resulting structure, top surface of conductive lines 120, dielectric layer 122, and conductive lines 134 may be substantially level.

Figure 25:
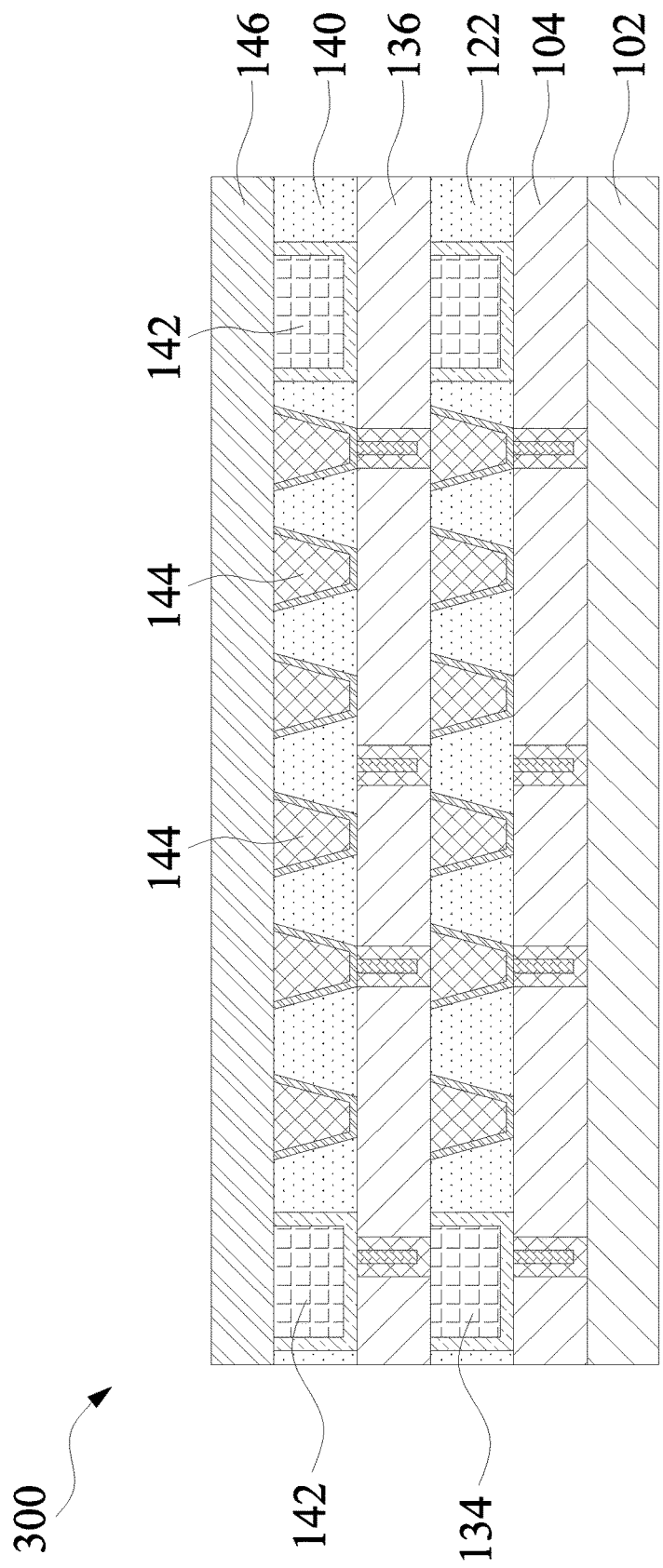

FIG. 25 illustrates a cross sectional view of a completed device 300. Device 300 may be substantially similar to device 100. However, fine-width conductive lines 120 and 144 have different shape in device 300 compared to device 100. For example, as a result of a damascene process used to form features of device 300, conductive lines 120 and 144 may be wider at a top surface than at a bottom surface based on the orientation illustrated in FIG. 25. In contrast, conductive lines 120 and 144 in device 100 may be substantially rectangular or may be wider at a bottom surface than at a tom surface, for example. Furthermore, a seed layer and/or barrier layer may be formed on sidewalls and a bottom surface of conductive lines 120 and 144. The seed layer may be used to form conductive lines 120 and 144 in an electrochemical plating process. In some embodiments, a combination of etching a blanket conductive layer and a damascene process may be used in the same device to form various fine-width conductive lines (e.g., conductive lines 120 and 144).

Figure 26:
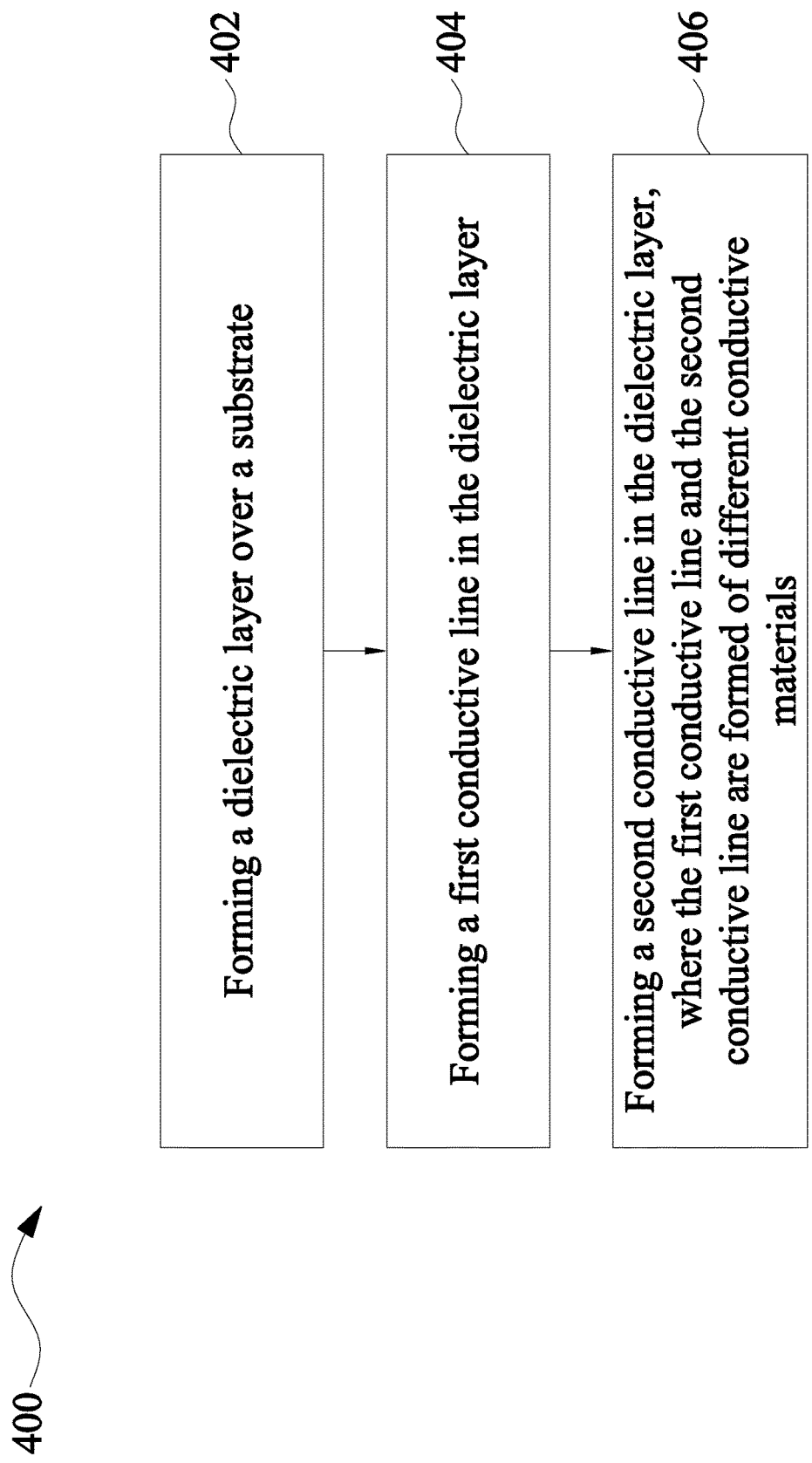
FIG. 26 illustrates a process flow of various steps for forming a semiconductor device in accordance with some embodiments.

FIG. 26 illustrates a process flow 400 for manufacturing a semiconductor device in accordance with some embodiments. In step 402, a dielectric layer is formed over a substrate. The dielectric layer may be formed using any suitable process such as PVD, CVD, a spin-on process, and the like, and the dielectric layer may comprise any suitable material (e.g., a low-k dielectric). In step 404, a first conductive line is formed in the dielectric layer. The first conductive line may be formed using a damascene process. The damascene process may include patterning an opening in the dielectric layer (e.g., using a combination of photolithography and etching) and filling the opening with a conductive material (e.g., by depositing a seed layer and using a plating process). In some embodiments, the first conductive line may be a wide conductive line (e.g., having a width greater than about 30 nm), and the first conductive line may comprise copper, copper alloy, or a combination thereof.

In step 406, a second conductive line is formed in the dielectric layer. The second conductive line may comprise a different conductive material than the first conductive line. For example in embodiments where the first conductive line comprises copper, the second conductive line may comprise Al, AlMn, AlCu, Co, W, alloys thereof, combinations thereof, or the like. In some embodiments, the first and second conductive lines may both intersect a common horizontal plane.

The order of steps illustrated in FIG. 26 is for ease of illustrate only. In some embodiments, step 406 may occur prior to steps 402 and/or 404. For example, the second conductive line may be formed by blanket depositing a conductive material (e.g., Al, AlMn, AlCu, Co, W, and the like) and patterning the conductive material (e.g., using a combination of photolithography and etching). Subsequently, the dielectric layer and the first conductive line may be formed around the second conductive line. Alternatively, the second conductive line maybe formed using a damascene process after forming the dielectric layer. In such embodiments, the second conductive line may be formed either before or after the first conductive line.

Various embodiments include the use of multiple different conductive materials in interconnect layers. For example, in a single interconnect layer, at least two different conductive materials may be used for different conductive lines. Copper (or a copper alloy) may be used for conductive lines having a larger width (e.g., having a width greater than about 30 nm) while Al, Co, W, alloys thereof, or combinations thereof may be used for fine-width conductive lines (e.g., having a width less than about 30 nm). The use of different conductive materials in a single interconnect layer having conductive lines allows for the use of copper for improved electrical characteristics (e.g., improved electro-migration (EM) characteristics) in larger conductive lines while still providing reliability for fine-width conductive lines. In some embodiments, the formation of such fine-width conductive lines may include etching a blanket-deposited conductive layer rather than a damascene process, increasing the process reliability. For example, etching a blanket-deposited conductive layer removes the need to first form a seed layer, reducing the possibility of void formation. Alternatively, a damascene process may be employed for both wide and fine-width conductive lines.

In accordance with an embodiment, a semiconductor device includes a substrate and a dielectric layer over the substrate. The dielectric layer includes a first conductive line and a second conductive line. The second conductive line comprises a different conductive material than the first conductive line.

In accordance with another embodiment, a semiconductor device includes a substrate, a first dielectric layer over the substrate, and a second dielectric layer over the first dielectric layer. The first dielectric layer has a plurality of vias. The second dielectric layer has a first plurality of conductive lines comprising copper and a second plurality of conductive lines. The second plurality of conductive lines comprises a different conductive material than copper. Furthermore, each of the first plurality of conductive lines is wider than each of the second plurality of conductive lines. The semiconductor device further includes passivation layer over the second dielectric layer.

In accordance with yet another embodiment, a method for forming a semiconductor device includes forming a dielectric layer over a substrate. A first conductive line and a second conductive line are formed in the dielectric layer. The first conductive line comprises a first conductive material, and the second conductive line comprises a second conductive material. The first conductive material is a different conductive material than the second conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device comprising:
    forming a dielectric layer over a substrate;
    forming a second conductive line in the dielectric layer, wherein the second conductive line comprises a second conductive material;
    after forming the second conductive line, depositing a barrier layer over a top surface and along sidewalls of the second conductive line; and
    forming a first conductive line in the dielectric layer, wherein the first conductive line comprises a first conductive material, wherein a top surface of the first conductive line is substantially level with a top surface of the barrier layer, and wherein the first conductive material is a different conductive material than the second conductive material.

2. The method of claim 1, wherein forming the second conductive line comprises blanket depositing the second conductive material.

3. The method of claim 2, wherein forming the second conductive line further comprises after blanket depositing the second conductive material, etching the second conductive material, and wherein etching the second conductive material comprises:
    using a chlorine based etchant when the second conductive material comprises aluminum; and
    using a fluorine based etchant when the second conductive material comprises cobalt or tungsten.

4. The method of claim 1, wherein forming the first conductive line comprises a damascene process.

5. The method of claim 1, wherein the first conductive material comprises copper, and wherein the second conductive material comprises aluminum, aluminum copper, aluminum manganese, cobalt, tungsten, or a combination thereof.

6. The method of claim 1, wherein forming the first conductive line comprises forming the first conductive line to have a first width, wherein forming the second conductive line comprises forming the second conductive line to have a second width, and wherein the first width is larger than the second width.

7. The method of claim 1, wherein forming the first conductive line comprises forming the first conductive line to extend through the barrier layer.

8. A method comprising:
blanket depositing a first conductive material over a substrate;
patterning the first conductive material to define a first conductive line;
depositing a first dielectric layer over and along sidewalls of the first conductive line;
patterning an opening in the first dielectric layer and adjacent the first conductive line, wherein a top of the opening is higher than a top surface of the first conductive line;
depositing a first barrier layer along sidewalls and a bottom surface of the opening, wherein a portion of the first dielectric layer is disposed between the first barrier layer and the first conductive line after depositing the first barrier layer; and
after depositing the first barrier layer, filling remaining portions of the opening with a second conductive material to define a second conductive line in the opening, wherein the second conductive material is different than the first conductive material.

9. The method of claim 8 further comprising:
depositing a second dielectric layer over the substrate;
patterning a via opening in the second dielectric layer;
depositing a second barrier layer over a top surface of second dielectric layer, along sidewalls of the via opening, and over a bottom surface of the via opening, wherein blanket depositing the first conductive material comprises blanket depositing the first conductive material on a top surface of the second barrier layer; and
filling remaining portions of the via opening with a third conductive material to define a conductive via in the via opening.

10. The method of claim 8 further comprising prior to depositing the first dielectric layer, depositing a third barrier layer over a top surface and sidewalls of the first conductive line.

11. The method of claim 8, wherein depositing a first dielectric layer comprises:
depositing the first dielectric layer to have a non-planar top surface;
using a spin-on process to depositing a third dielectric layer on a top surface of the first dielectric layer; and
planarizing the first dielectric layer and the third dielectric layer.

12. The method of claim 8, wherein the first conductive material comprises aluminum, aluminum copper, aluminum manganese, cobalt, tungsten, or a combination thereof, and wherein the second conductive material comprises copper.

13. A method comprising:
depositing a first barrier layer over a top surface of a first dielectric layer;
blanket depositing a first conductive material on the first barrier layer;
patterning the first conductive material and the first barrier layer to define a first conductive line;
depositing a second barrier layer over a top surface and along sidewalls of the first conductive line;
depositing a second dielectric layer over the second barrier layer; and
forming a second conductive line extending through the second dielectric layer and the second barrier layer, wherein the second conductive line comprises:
a second conductive material different than the first conductive material wherein top surfaces of the second conductive material, the second barrier layer, and the second dielectric layer are substantially level; and
a third barrier layer on sidewalls and a bottom surface of the second conductive material.

14. The method of claim 13, wherein depositing the second dielectric layer comprises:
depositing the second dielectric layer to have a non-planar top surface; and
depositing a dielectric film over the second dielectric layer.

15. The method of claim 13 further comprising:
forming a third dielectric layer over the second dielectric layer;
patterning an opening through the third dielectric layer and the second barrier layer; and
forming a conductive via in the opening.

16. The method of claim 13, wherein the second conductive line is wider than the first conductive line.

17. The method of claim 13, wherein a sidewall of the third barrier layer contacts a sidewall of the second barrier layer.

* * * * *